United States Patent [19]

Matsuda et al.

[11] Patent Number: 4,923,715
[45] Date of Patent: May 8, 1990

[54] METHOD OF FORMING THIN FILM BY CHEMICAL VAPOR DEPOSITION

[75] Inventors: Tetsuo Matsuda, Tokyo; Iwao Kunishima, Yokohama, both of Japan

[73] Assignee: Kabushiki Kaisha Toshiba, Kawasaki, Japan

[21] Appl. No.: 358,493

[22] Filed: May 30, 1989

Related U.S. Application Data

[63] Continuation of Ser. No. 13,434, Feb. 11, 1987, abandoned.

[30] Foreign Application Priority Data

Mar. 31, 1986 [JP] Japan .................................. 61-70781
Sep. 16, 1986 [JP] Japan .................................. 61-217505

[51] Int. Cl.$^5$ .......................... B05D 7/22; C23C 16/08
[52] U.S. Cl. .................................. 427/237; 427/253; 427/255
[58] Field of Search .................. 427/255.2, 255.7, 255, 427/253, 250, 237

[56] References Cited

U.S. PATENT DOCUMENTS

| | | | |
|---|---|---|---|
| 3,031,338 | 4/1962 | Bourdeau | 427/237 |
| 3,178,308 | 4/1965 | Oxley et al. | 427/237 |
| 3,746,569 | 7/1973 | Pammec et al. | 427/237 |
| 4,123,989 | 11/1978 | Jewett | 427/237 |
| 4,650,698 | 3/1987 | Moriya et al. | 427/253 |

FOREIGN PATENT DOCUMENTS 0134645  3/1985  European Pat. Off. ............ 427/237

*Primary Examiner*—Sadie Childs
*Attorney, Agent, or Firm*—Oblon, Spivak, McClelland, Maier & Neustadt

[57] ABSTRACT

A method for the formation of a thin, high melting-point metal film such as W, on a substrate surface, by means of CVD, is disclosed herein. In this method, the inner wall of the CVD reaction tube and the surface of the at least part of the fittings disposed therewithin are covered with a metal nitride film, in the process of performing the CVD operation. The method permits the formation of a high quality film, and also prevents the deposition of the high melting-point metal on the inner wall of the reaction chamber, even if the CVD operation is repeatedly performed over a long period of time.

17 Claims, 3 Drawing Sheets

METHOD OF FORMING THIN FILM BY CHEMICAL VAPOR DEPOSITION

This application is a continuation of application Ser. No. 013,434, filed on Feb. 11, 1987, now abandoned.

BACKGROUND OF THE INVENTION

1. Field of the Invention

The present invention relates to a method of forming a high quality, high melting-point metal film on a substrate surface, by means of chemical vapor deposition (CVD).

2. Description of the Prior Art

Recently, a thin, high melting-point metal film has come to be used as a fine metallic wiring material for high-density integrated circuits. The group of high melting-point metals includes Ti, W, Mo, and Ta. While the following description exemplifies tungsten, it can apply equally to the other high melting-point metals.

In order to form a thin W film, a gaseous phase growth by use of CVD is employed, along with, for example, $WF_6$ and $H_2$ being used as the raw material gases. The gaseous phase reaction involved in this technique is as follows:

$$WF_6 + 3H_2 \rightarrow W + 6HF$$

It is important to note that in the gaseous phase reaction outlined above, the W thin film is unlikely to grow on an insulation film, for example, a $SiO_2$ film, because the insulation film is believed not to provide a suitable catalytic surface for promoting the gaseous phase reaction, unlike a metal or semiconductor surface which provides an appropriate catalytic surface therefor. It follows that it is possible to selectively form a W thin film on only predetermined regions of a substrate surface, thus making it possible to form a fine W wiring pattern without the need to employ a patterning step. This particular technique is known as a Selective CVD Method.

However, the formation of a thin W film, by use of the CVD described above, gives rise to a serious problem. Specifically, the selectivity of the W film formation is not complete In particular, where the gaseous phase growth is allowed to continue for a long time, in a reaction temperature (or substrate temperature) exceeding 400° C., W becomes deposited, to a slight extent, on the insulation film itself. In particular, where the insulation film is formed of, for example, $SiO_2$, HF, formed by the gaseous phase reaction carried out in high temperature conditions, is believed to react with $SiO_2$, to form $SiF_4$ on which W is likely to be deposited, and to impair the selectivity of the W film formation, this reaction being as follows:

$$SiO_2 + 4HF \rightarrow SiF_4 + 2H_2O$$

However, where a wiring layer of a W thin film is formed on a semiconductor substrate by, for example, a selective CVD method, the treatment time for the individual wafers is short. Thus, reduction in selectivity for individual wafers is relatively small, because each wafer is replaced by new wafer.

On the other hand, a CVD apparatus is used repeatedly over a long period of time. Thus, in the case of, for example, a diffusion furnace type CVD apparatus, the deposition of W on the inner wall of a quartz ($SiO_2$) reaction tube continues over an extended period of time. To be more specific, when the CVD operation is performed over a long period of time, fine W particles become deposited primarily on the inner wall of the reaction tube. What should be noted is that the deposited fine W particles provide the catalytic surface for the W growth reaction referred to previously, thereby leading to a rapid W deposition thereafter. The rate of growth of the W film, on the semiconductor surface, lowers rapidly in accordance with the amount of W deposition on the inner wall of the reaction tube. It follows that it is impossible to form a W film rapidly in high-temperature conditions. In addition, it is impossible to control the thickness of the W film. An additional difficulty arises, in that the W particles deposited on the inner wall of the reaction tube are only weakly attached to the surface thereof, with the result that they tend to peel off the surface of the wall during the vapor phase growing step. The W particles in question drop onto the substrate, with the result that particle-like defects appear on the film growing on the substrate. Naturally, these defects present serious problems to be solved, in order to form a fine circuit in a high density integrated circuit.

The difficulties noted above occur not only in the diffusion type CVD apparatus but also in a stainless steel CVD apparatus called a cold wall type. It should be noted that W particles are likely to become deposited on the surface of the stainless steel itself. Thus, in the cold wall type CVD apparatus, the wall of the reaction chamber is cooled so as to prevent the deposition of W on the wall. However, a susceptor having a substrate mounted thereon is provided with a heater, to heat the substrate to a temperature at which the vapor phase growth reaction can take place, with the result that W particles are deposited on the susceptor surface. In another type of cold wall CVD apparatus, the substrate mounted on the susceptor is heated by irradiation of infrared rays through a window of the reaction chamber. In this case, the susceptor and inner wall of the reaction chamber are also partly irradiated with the infrared rays. The irradiated parts become heated, thereby to cause the deposition of W. It follows that the difficulties, such as a marked reduction in the W film growth rate, which are inherent in the diffusion furnace type CVD apparatus, also take place in the cold wall type CVD apparatus.

SUMMARY OF THE INVENTION

The present invention relates to the formation of a thin, high melting-point metal film, such as W, on a substrate surface, by means of CVD, and is intended to provide a method for efficiently forming such a high quality film, this method being capable of preventing the deposition of the high melting-point metal on the inner wall of the reaction chamber, even if the CVD operation is performed repeatedly over a long period of time.

According to the present invention, there is provided a method of forming, by means of CVD (chemical vapor deposition), a thin, high melting-point metal film on a surface of a substrate situated within a CVD reaction tube, wherein the inner wall of the CVD reaction tube and the surface of at least part of the fittings disposed therewithin are covered with a metal nitride film, in the process of performing the CVD operation.

The fittings noted above include, for example, a supporting rod, baffles, and a quartz boat used in a diffusion furnace type CVD apparatus, and a susceptor used in a cold wall type CVD apparatus.

In the present invention, a metal nitride film is formed on, for example, the inner wall of the reaction tube of the CVD apparatus, by introducing an N-containing gas such as an ammonia gas, into the reaction chamber. In this case, the reaction tube is heated in order to nitride the desired portion of the metal surface. Alternatively, a metal nitride film may be deposited on the desired surface, by means of CVD, using a metal-containing gas and an N-containing gas. In this case, the metal contained in the raw material gas should desirably be a high melting-point type and be used for forming a thin film on the substrate.

The resultant metal nitride film is in the form of an interstitial alloy in which nitrogen atoms intervene in the metal crystal lattice. Thus, the stoichiometric molar ratio between the metal and nitrogen atoms forming the metal nitride is indefinite. In the case of tungsten nitride, for example, the compounds include $W_2N$, $WN$, etc., which are collectively denoted by the formula $WN_x$. In the following description, $W_2N$ is used as the typical tungsten nitride. However, the following description also applies to tungsten nitrides of other chemical formulas. As was mentioned above, the nitride of a high-melting point metal forming the thin film is in the form of an interstitial alloy. It follows that a thin film formed of any kind of nitride is electrically conductive.

In the present invention, a metal nitride film is formed, in advance, on the inner surface of, for example, a quartz reaction tube, with the result that particles of a high-melting point metal deposited on the inner wall of the reaction tube are covered with the metal nitride thin film. The present inventors have confirmed, by experiments, that it is difficult for W particles to deposit on a metal nitride film as well as a $SiO_2$ film, in the selective formation of a W film on a substrate, by the CVD method, using a gaseous mixture consisting of $WF_6$ and $H_2$. As a result, undesired deposition of a new metal film on the inner wall of the reaction tube, etc. is suppressed in the present invention. This makes it possible to prevent the raw material gas from being consumed on the inner wall of the reaction tube. It is also possible to prevent the inner wall from being corroded by the gaseous reaction product. It follows that the method of the present invention permits a desired high-melting point metal film to be formed rapidly and accurately, on a substrate, even in high temperature conditions. It should also be noted that the metal particles deposited on, for example, the inner wall of the reaction tube, is covered with the metal nitride film, so as to prevent any further growth thereof. Naturally, the metal film is prevented from dropping from the inner wall of the reaction tube, thereby rendering possible the formation of a high quality thin film free from particle-like defects.

DESCRIPTION OF THE PREFERRED EMBODIMENTS

Figure 1:
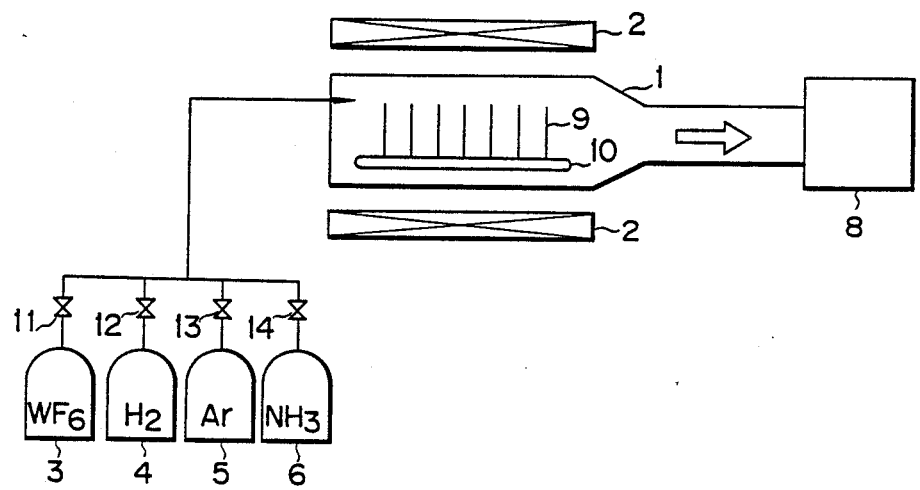
FIG. 1 schematically illustrates a CVD apparatus used for embodying a method according to the present invention.

A diffusion furnace type CVD apparatus shown in FIG. 1 is used for embodying the method of the present invention. As can be seen from the drawing, the apparatus comprises a quartz reaction tube 1, a heater 2 disposed outside reaction tube 1, for heating the reaction zone within tube 1, a vacuum pump 8, and gas supply systems 3–6 connected to reaction tube 1. The gas supply, from systems 3–6 to reaction tube 1, is controlled by valves 11–14. It can be seen that a plurality of substrates 9, on which thin films are to be formed, are supported on a quartz boat 10 situated within reaction tube 1. Incidentally, a quartz supporting rod (not shown) for moving boat 10 into and out of reaction tube 1, a quartz heat baffle (not shown) for making the temperature distribution uniform, etc. are mounted in reaction tube 1.

A tungsten thin film is formed by the CVD method, using the apparatus shown in FIG. 1, as follows:

EXAMPLE 1

Figure 2A:
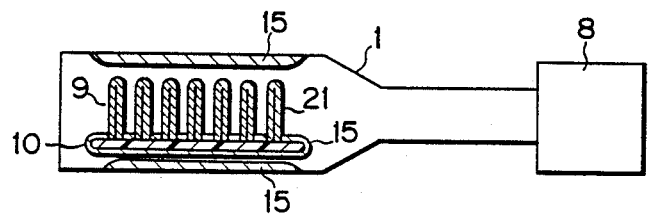
FIGS. 2A and 2B schematically illustrate a method for forming a thin film according to one embodiment of the present invention.

After cleaning quartz reaction tube 1, quartz boat 10, having a plurality of substrates 9 supported thereon, is positioned in the reaction zone within reaction tube 1, as is shown in FIG. 1. The reaction zone is then heated to 350°–600° C., whereupon it is evacuated by the vacuum pump 8. When the pressure in the reaction zone is reduced to 0.1 to 1.0 Torr, $WF_6$ gas and $H_2$ gas are supplied thereinto, from gas supply systems 3 and 4, respectively. Under these conditions, a W film 21 having a thickness of, for example, 0.1 to 1.0 μm is formed by gaseous growth on each of substrates 9, as is shown in FIG. 2A. In this case, W particles are also deposited, though only to a very slight extent, on the inner wall of reaction tube 1, boat 10, the quartz supporting rod, the heat baffle, etc. to form W film 15 thereon.

Figure 2B:
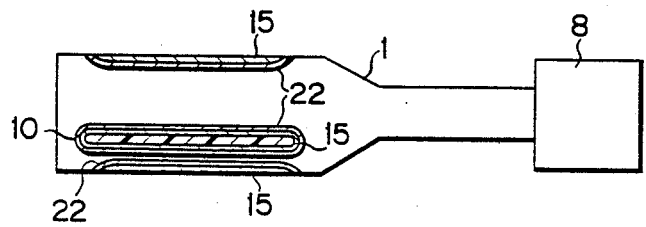

After the formation of W film 15, valves 11 and 12 are closed to stop the supply of gas from the gas supply systems 3 and 4. When the temperature within the reaction tube has lowered, Ar gas is supplied from gas supply system 5 into reaction tube 1. Then, boat 10, from which substrates 9 have been removed, is once again positioned within reaction tube 1, as is shown in FIG. 2B, and this is followed by the evacuating of the reaction zone. Again, the reaction zone is heated to 350°–1000° C., and under these conditions, ammonia gas ($NH_3$) is supplied from gas supply system 6 into reaction tube 1 for, for example, 30 minutes. As a result, the fine W particles deposited on the inner wall of reaction tube 1, the surface of boat 10, etc. are nitrided to form tungsten nitride ($W_2N$) layers 22.

Where W films are formed again on other substrates, it is not necessary to wash quartz reaction tube 1 and quartz boat 10 in advance. Specifically, it suffices to position nitrided boat 10, having the aforementioned other substrates thereon, within reaction tube 1, followed by repeating the W film-forming process and the nitriding process described above.

EXAMPLE 2

In Example 1 described above, tungsten nitride film 22 is formed by the nitriding treatment using ammonia gas. Alternatively, a tungsten nitride film may be directly formed by the CVD method described below.

Specifically, W film 21 is formed on substrate 9, in the exact same manner as in Example 1. In Example 2, however, WF$_6$ gas is introduced, together with the ammonia gas, into the reaction tube, after the formation of W film 21, so as to permit the desired CVD reaction for the deposition of W$_2$N. As a result, W$_2$N film 22 is formed on the surfaces of the inner wall of reaction tube 1 and on boat 10. It follows that W film 21 is covered with W$_2$N film 22, as in Example 1.

Where W films are formed again on other substrates, then, as in the case of Example 1, it is not necessary to wash quartz reaction tube 1 and quartz boat 10 in advance. Specifically, it suffices to position nitrided boat 10, having the aforementioned other substrates thereon, within reaction tube 1, followed by repeating the W film-forming process and the nitriding process described above.

EXAMPLE 3

In the present invention, it is also possible to form W$_2$N film 22 without having to remove substrate 9 from reaction tube 1, after formation of W film 21. In this case, W film 21 is formed first, on substrate 9, in exactly the same manner as in Example 1. Then, W$_2$N film 22 is consecutively formed, as in Example 1 or 2, with substrate 9 still in reaction tube 1. It should be noted that, in Example 3, it is possible to form a laminated structure consisting of W film 21 and W$_2$N film 22, on substrate 9.

As is apparent from Examples 1-3 described above, a tungsten nitride film is formed on the inner surface of reaction tube 1, etc. in the method of the present invention, thereby making it possible to maintain a high W film deposition rate on the substrate, over repeated operations for forming W film thereon. Conversely, in the prior art, the W film deposition rate on the substrate is markedly lowered as the number of operations (or time) for forming the W film thereon, increases.

Figure 3:
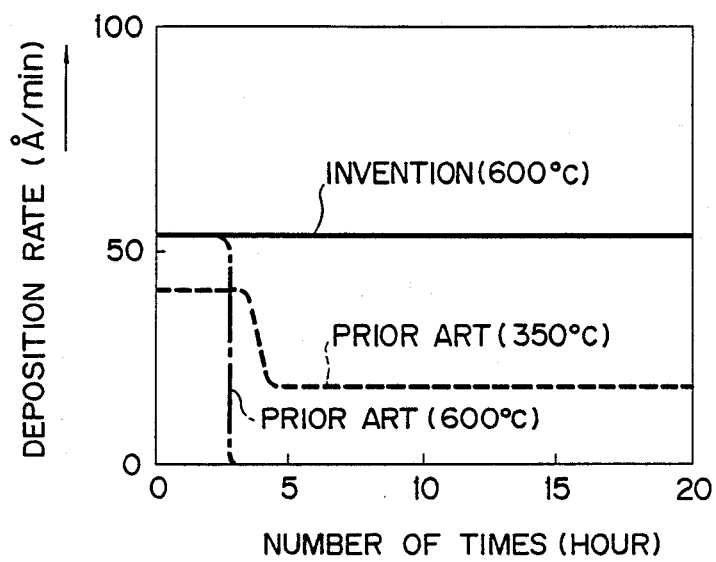
FIGS. 3 and 4 show the effects of the present invention in comparison with the prior art.

To be more specific, FIG. 3 shows the change with time in the rate of W deposition carried out at 600° C., according to the method of the present invention. For comparison, FIG. 3 also shows conventional cases in which the W deposition was carried out without employing the nitriding step. As is apparent from FIG. 3, the deposition rate lowers rapidly, in the case of the prior art, if the number of operations required for the depositing of W film (each operation being continued for 1 hour) exceeds 4, even in the case where the reaction is carried out at 350° C. It can be seen that the deposition rate is lowered, reaching half the initial rate at about the 5th operation. Where the reaction temperature is set at 600° C. in the prior art, the initial deposition rate can be maintained for only 2 hours, and is lowered to zero about 2.5 hours later, thereby making formation of the film impossible. In the present invention, however, the decrease in the deposition rate, from the initial rate, can be suppressed to within 5%, even at the 20th depositing operation.

Figure 4:
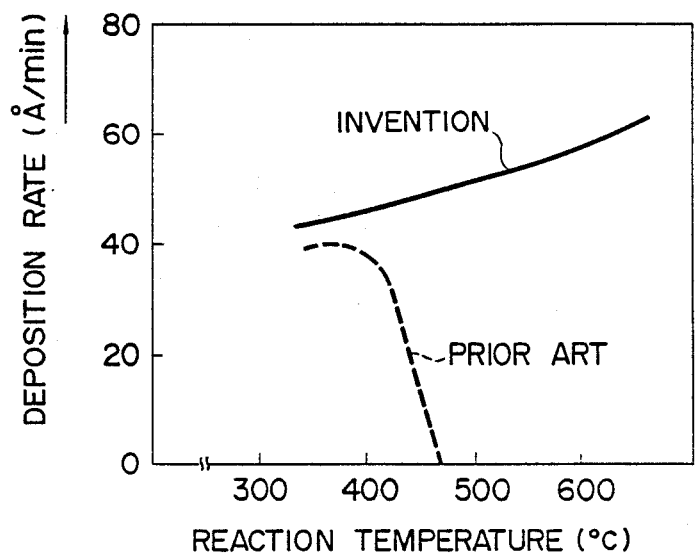

FIG. 4 shows the change in the average deposition rate relative to the reaction temperature, with respect to both the present invention and the prior art. It can be seen that the deposition rate is lowered in the prior art, if the reaction temperature exceeds 400° C. It is believed that the reaction given below takes place, so as to facilitate the deposition of W on the inner wall of the quartz reaction tube, leading to the lowered deposition rate mentioned above:

$$SiO_2 + 4HF \rightarrow SiF_4 + 2H_2O$$

In the present invention, however, the average deposition rate increases in a substantially uniform manner, even if the reaction temperature is elevated to 700° C. because the CVD operation is performed with the inner wall of the reaction tube covered with a W$_2$N layer.

Further, the method of the Examples described previously, makes it possible to obtain a high quality W film having a low particle-like defect density, because the W particles deposited on the inner wall of the reaction tube are prevented from falling off the inner wall thereof. Where, for example, the CVD operation is repeatedly performed for 10 hours (each operation being continued for 1 hour), with the reaction temperature set at 350° C., the particle-like defect density on the surface of the resultant W film has been found to be 50 defects/cm$^2$ in the prior art, compared with only about 10 defects/cm$^2$ in the present invention. Still further, the defect density in question increases, in the prior art, as the number of CVD operations increases. In the present invention, however, the defect density has been found to be only about 12 defects/cm$^2$, even at the 20th CVD operation.

Figure 5A:
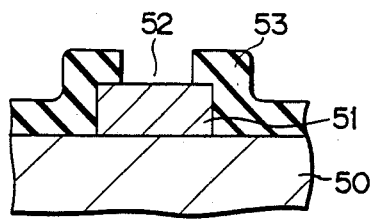
FIGS. 5A to 5C and 6A to 6C exemplify cases where the technical idea of the present invention is applied to a selective CVD method.
Figure 5B:
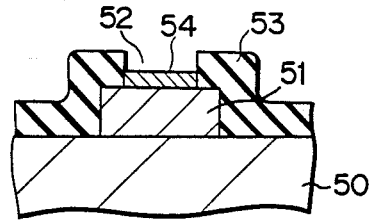
Figure 5C:
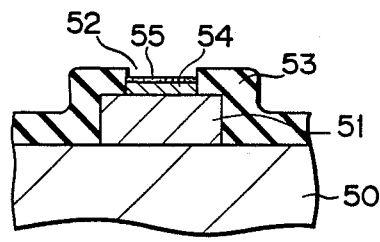
Figure 6A:
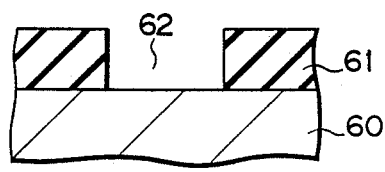
Figure 6B:
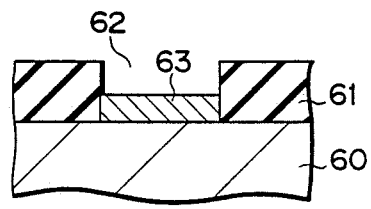
Figure 6C:
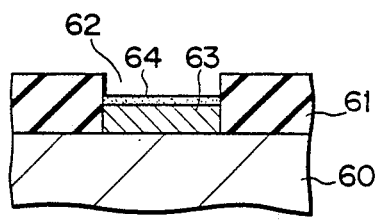

FIGS. 5 and 6 illustrate the cases where the method of the present invention is applied to the selective CVD method employed in the manufacture of a semiconductor device. In these cases, it is possible to improve the step coverage of the wiring layer by forming the W film in the contact hole, before formation of the wiring layer itself.

The technical idea of the present invention is applied to the multi-layer wiring in the embodiment of FIG. 5. As can be seen from FIG. 5A, a first polysilicon wiring layer 51, formed on a silicon substrate 50, is covered with a SiO$_2$ film 53. This is followed by selectively removing the SiO$_2$ film 53, to provide a contact hole 52. Under these conditions, a W film is deposited, by selective CVD, to form a W film 54 within contact hole 52, as is shown in FIG. 5B. It should be noted that contact hole 52 is filled with the W film, in this fashion, making it possible to improve the step coverage of a second wiring layer formed thereon.

In the embodiment of FIG. 6, a contact hole 62 is made by RIE or the like, in a SiO$_2$ film 61 covering a silicon substrate 60, as is shown in FIG. 6. This is followed by filling contact hole 62 with a W film 63, by means of selective CVD, as is shown in FIG. 6B.

The method of Example 3 produces prominent effects, when applied to the processes of FIGS. 5 and 6. Specifically, the surfaces of W films 54 and 63, which fill the contact holes, are covered with W$_2$N films 55 and 64, respectively. The presence of these W$_2$N films is highly significant in the case of using polysilicon for forming, for example, the second wiring layer. If the W$_2$N film in question is not formed, Si of the second wiring layer is diffused into W films 54 and 63 to thereby form tungsten silicide, resulting in an approximately tenfold increase in the sheet resistance of the films. Also, the conversion to tungsten silicide results in a volume decrease of about 30 %, leading to crack occurrence. In the present invention, however, W$_2$N films 55 and 64, covering the W films 54 and 63, respectively, serve to prevent Si diffusion. Naturally, the difficulties noted above do not arise in the present invention. It should also be noted that W$_2$N is electrically conductive and, thus, presents no problem in terms of electrical conductivity, even if the W$_2$N film is left unremoved.

Further, a $W_2N$ film offers high resistance to oxidation. It follows that, where it is necessary to apply an oxidation treatment after, for example, the selective CVD process, with the W film surface left exposed to the outside, the $W_2N$ film serves to protect the film below it.

In the Examples described above, a $W_2N$ film is formed every time a W film has been formed on the substrate. In addition, the object of the present invention can be achieved by forming a $W_2N$ film after the operation for forming a W film has been consecutively performed two times or more. Also, in the examples described above, the initial operation for forming a W film is carried out without forming, in advance, a $W_2N$ film. However, it is of course possible to form a $W_2N$ film before the initial operation for forming a W film on the substrate. Further, the material of the reaction tube, boat, etc. need not be restricted to quartz. A metal having a high melting point, such as W, may also be used for forming the reaction tube, etc. In this case, a $W_2N$ film is formed by means of the nitriding treatment or CVD, in preparation for even the initial operation for forming a W film on the substrate. This is also the case with the use of a cold wall type CVD apparatus.

What is claimed is:

1. A method of forming, by means of CVD (Chemical Vapor Deposition), a thin film of high melting-point metal selected from the group consisting of Ti, W, Mo and Ta, comprising the steps of:
   (a) forming a metal film of the high melting-point metal on the surface of the inner wall of a quartz CVD reaction tube and on at least a part of the fittings disposed therein;
   (b) forming a nitride film of the high melting-point metal on the metal film formed in step (a), by nitriding the surface of the metal film, said nitriding being carried out by heat-treatment in an atmosphere containing ammonia;
   (c) forming, by carrying out the CVD, the thin film of the high melting-point metal on a surface of a substrate situated in the CVD reaction tube from a fluoride of the high melting-point metal.

2. A method according to claim 1, wherein the fittings disposed within the reaction tube comprise a quartz boat for supporting the substrate, a supporting rod for the boat, and a heat baffle.

3. A method according to claim 1, wherein the substrate is an electrically conductive substrate having an insulation pattern formed thereon, and the high melting-point metal film is selectively formed on the conductive surface of the substrate which is not covered with the insulation pattern.

4. A method according to claim 1, wherein step (b) is repeated after step (c), with the substrate, on which the thin film of the high melting-point metal has been formed in step (c), being left in the CVD reaction tube.

5. A method according to claim 4, wherein the thin film of the high melting-point metal is formed selectively on said substrate within a contact hole therein step (c), and the nitride film of the high melting-point metal is formed selectively on the surface of the thin film in step (b).

6. A method according to claim 1, wherein the nitride film comprises a nitride of the high melting-point metal, whose stoichiometric molar ratio between the metal and nitrogen is indefinite.

7. A method according to claim 1, wherein the high melting-point metal of the metal film in step (a) is identical with that of the thin film in step (c).

8. A method according to claim 1, wherein the nitriding is conducted at the temperature of 350-1000° C.

9. A method of forming, by means of CVD (Chemical Vapor Deposition), a thin film of high melting-point metal selected from the group consisting of Ti, W, Mo and Ta, comprising the steps of:
   (a) forming a metal film of the high melting-point metal on the surface of the inner wall of a quartz CVD reaction tube and on at least a part of the fittings disposed therein;
   (b) forming a nitride film of the high melting-point metal on the metal film formed in step (a), by carrying out the CVD using fluoride of the high melting-point metal and ammonia;
   (c) forming, by carrying out the CVD, the thin film of the high melting-point metal on a surface of a substrate situated in the CVD reaction tube from a fluoride of the high melting-point metal.

10. A method according to claim 9, wherein the fittings disposed within the reaction tube comprise a quartz boat for supporting the substrate, a supporting rod for the boat, and a heat baffle.

11. A method according to claim 9, wherein the substrate is an electrically conductive substrate having an insulating pattern formed thereon, and the high melting-point metal film is selectively formed on the conductive surface of the substrate which is not covered with the insulation pattern.

12. A method according to claim 9, wherein step (b) is repeated after step (c), with the substrate, on which the thin film of the high melting-point metal has been formed in step (c), being left in the CVD reaction tube.

13. A method according to claim 12, wherein the thin film of the high melting-point metal is formed selectively within a contact hole of the substrate in step (c), and the nitride film of the high melting-point metal is formed selectively on the surface of the thin film in step (b).

14. A method according to claim 9, wherein the nitride film comprises a nitride of the high melting-point metal, whose stoichiometric molar ratio between the metal and nitrogen is indefinite.

15. A method according to claim 9, wherein the high melting-point metal of the metal film in step (a) is identical with that of the thin film in step (c).

16. A method according to claim 9, wherein the fluoride of the high melting-point metal used in step (b) is tungsten fluoride.

17. A method of forming, by means of CVD (Chemical Vapor Deposition) in a quartz CVD reaction tube, a thin film of high melting-point metal selected from the group consisting of Ti, W, Mo and Ta, on a surface of a substrate situated within the CVD reaction tube, wherein the CVD is performed after a nitride film of the high melting-point metal is formed on the surface of the inner wall of the CVD reaction tube and on at least a part of the fittings disposed therein.

* * * * *